United States Patent
Nishidate

(10) Patent No.: US 7,728,233 B2
(45) Date of Patent: Jun. 1, 2010

(54) CONNECTION STRUCTURE OF FLEXIBLE SUBSTRATE

(75) Inventor: Tetsuo Nishidate, Daito (JP)

(73) Assignee: Funai Electric Co., Ltd. (JP)

( * ) Notice: Subject to any disclaimer, the term of this patent is extended or adjusted under 35 U.S.C. 154(b) by 189 days.

(21) Appl. No.: 12/003,876

(22) Filed: Jan. 3, 2008

(65) Prior Publication Data

US 2008/0166577 A1 Jul. 10, 2008

(30) Foreign Application Priority Data

Jan. 9, 2007 (JP) ............................. 2007-000930

(51) Int. Cl.
*H05K 1/00* (2006.01)
(52) U.S. Cl. .................. 174/254; 174/72 A; 174/261; 361/749; 361/760; 361/776
(58) Field of Classification Search ......... 174/250–255, 174/72 A, 256, 261–262; 361/749, 760, 361/776
See application file for complete search history.

(56) References Cited

U.S. PATENT DOCUMENTS 3,009,010 A * 11/1961 Stearns et al. ............. 174/72 A
3,808,505 A * 4/1974 Reimer ....................... 361/789
4,000,558 A * 1/1977 Cahill ......................... 29/850
4,587,719 A * 5/1986 Barth ......................... 438/113
5,250,758 A * 10/1993 Fjelstad et al. ............. 174/254
6,822,168 B2 * 11/2004 Klesing et al. ............. 174/254

FOREIGN PATENT DOCUMENTS

JP 2-201992 8/1990
JP 5-067478 3/1993

* cited by examiner

*Primary Examiner*—Cathy Lam
(74) *Attorney, Agent, or Firm*—Bacon & Thomas, PLLC

(57) ABSTRACT

In the case of connecting a flexible substrate to a counterpart substrate by soldering, the area of a dead space on the counterpart substrate due to being covered with the flexible substrate is reduced to reduce the outside dimension of the counterpart substrate. Solder lands 61 and 62 on the flexible substrate 5 are soldered to solder lands 21 and 22 on the counterpart substrate 1. The flexible substrate 5 is divided into two branching pieces 71 and 72 by an incision 7 or a slit 8 formed in such a manner as to extend from an intermediate part in the arrangement direction R of circuit patterns to the leading end of the flexible substrate. The space between the solder lands 61 and 62 on the respective pieces 71 and 72 is made equal to the space between the two spaced-apart solder lands 21 and 22 on the counterpart substrate 1 by placing the pieces 71 and 72 formed by dividing the flexible substrate 5 on one another.

4 Claims, 4 Drawing Sheets

CONNECTION STRUCTURE OF FLEXIBLE SUBSTRATE

BACKGROUND OF THE INVENTION

1. Field of the Invention

The present invention relates to a connection structure of a flexible substrate, in particular, with measures taken therein to narrow the space between two spaced-apart solder lands formed on a counterpart substrate and thereby to facilitate reducing the size of the counterpart substrate in the case of connecting solder lands formed in both of the lateral edge portions of the flexible substrate to the two respective spaced-apart solder lands on the counterpart substrate by soldering.

2. Description of the Related Art

FIG. 6 is a plan view showing a connection structure of a flexible substrate according to a conventional example, and FIG. 7 is an illustrative enlarged cross-sectional view along the arrows VII-VII in FIG. 6. Further, FIG. 8 is a schematic plan view showing a counterpart substrate 1 according to the conventional example, and FIG. 9 is a schematic plan view showing a flexible substrate 5 according to the conventional example.

The counterpart substrate 1 in FIG. 8 is a circuit board, called PCB, with circuit patterns (not shown in the drawing) being formed on the surface of a rigid base material, the circuit patterns including electrical and electronic elements (not shown in the drawing) such as capacitors, ICs, and resistors mounted on the substrate 1 to form a predetermined control circuit as a whole.

On the other hand, the flexible substrate 5 in FIG. 9 has many parallel circuit patterns (not shown in the drawing) arranged on a base material and has flexibility as a whole, the flexibility allowing the circuit patterns to be turned relatively freely in any direction.

Then, solder lands 61 and 62 are formed in both of the lateral edge portions 51 and 52 of the flexible substrate 5 as shown in FIG. 9, and two spaced-apart solder lands 21 and 22 for soldering the respective solder lands 61 and 62 on the flexible substrate 5 thereon are formed on the counterpart substrate 1 as shown in FIG. 8. In the case of connecting the flexible substrate 5 in FIG. 9 to the counterpart substrate 1 in FIG. 8 by soldering, the space between the solder lands 21 and 22 on the counterpart substrate 1 is conventionally made equal to the space between the solder lands 61 and 62 on the flexible substrate 5 in a flat shape, and then the flexible substrate 5 is placed on the counterpart substrate 1 for soldering of the solder lands 21, 22, 61, and 62 as shown in FIG. 6. This causes the space S1 between the two spaced-apart solder lands 21 and 22 shown in FIG. 8 to be covered with the flexible substrate 5, after the connection, to be a dead space.

Meanwhile, there has been proposed a technique in which only one space for connecting multiple flexible substrates thereto is to be formed on another flexible substrate to thereby facilitate ensuring a connection space by taking measures so that the multiple flexible substrates are placed and pressed on one another when the multiple flexible substrates are connected to the another flexible substrate (refer to Japanese Patent Laid-Open Publication No. Hei 2-201992 for example).

There has also been proposed a technique in which the both sides of a main printed board are overlapped with a folded connection piece of another printed board and the overlapped portions are fastened and fixed using a screw and/or a holding metal (refer to Japanese Patent Laid-Open Publication No. Hei 5-67478 for example).

Meanwhile, it is known that PCBs like the counterpart substrate 1 shown in FIG. 6 and other figures increase in cost with an increase in the outside dimension thereof. It is therefore desired to reduce the size of the counterpart substrate 1 as small as possible and thereby to achieve cost reduction. Similarly, it is known that the flexible substrate 5 shown in FIG. 9 increases in cost with an increase in the outside dimension thereof, and therefore it is desired to reduce the size of the flexible substrate 5 as small as possible.

However, in the present circumstances, the outside dimensions of the counterpart substrate 1 and the flexible substrate 5 are reduced only by increasing the density of many circuit patterns formed thereon and/or increasing the mounting density of electrical and electronic elements as high as possible.

SUMMARY OF THE INVENTION

Hence, the present inventor focused his attention on the facts that the width of the space S1 between the two spaced-apart solder lands 21 and 22 shown in FIG. 8 has a dimension appropriate to the width between the solder lands 61 and 62 on the flexible substrate 5 shown in FIG. 9 and that the space S1 is a dead space in the connection structure shown in FIG. 6 unavailable for mounting of electrical and electronic elements such as ICs and capacitors, and considered that reducing the area of the space S1 could reduce the outside dimension of the counterpart substrate 1 accordingly.

Under such circumstances, the present inventor has worked out a connection structure of a flexible substrate whereby the width dimension W and therefore the outside dimension of the counterpart substrate 1 shown in FIG. 6 can be reduced by reducing the width W1 between the two spaced-apart solder lands 21 and 22 on the counterpart substrate 1, that is, reducing the width of the space S1 in FIG. 8 without changing the density of many circuit patterns on the flexible substrate 5 in FIG. 9.

Accordingly, it is an object of the present invention to provide a connection structure of a flexible substrate whereby the outside dimension of a counterpart substrate can be reduced by reducing the area of a dead space on the counterpart substrate due to being covered with a flexible substrate when the flexible substrate is connected by soldering to the counterpart substrate.

The present invention is directed to a connection structure of a flexible substrate in which solder lands formed in both of the lateral edge portions of the flexible substrate that has many parallel circuit patterns arranged thereon are connected by soldering, respectively, to two spaced-apart solder lands formed on a counterpart substrate.

Then, the flexible substrate is divided into two pieces between adjacent circuit patterns, and the space between the solder lands on the respective pieces is made equal to the space between the two spaced-apart solder lands on the counterpart substrate by placing the pieces on one another partially so as not to include portions where the solder lands are formed.

In accordance with the arrangement above, the pieces are formed by dividing the flexible substrate between adjacent circuit patterns, which causes no change in the density of the circuit patterns on the flexible substrate. Despite this, with the arrangement that the space between the solder lands on the respective pieces is made equal to the space between the two spaced-apart solder lands on the counterpart substrate by placing the pieces on one another partially so as not to include portions where the solder lands are formed, the space between the two spaced-apart solder lands on the counterpart substrate becomes narrower than the space between the solder lands on the flexible substrate before the division. As a result, the width of the space S1 shown in FIG. 8 is reduced, that is, the width W1 between the two spaced-apart solder lands 21 and 22 on the counterpart substrate 1 shown in FIG. 6 is reduced, which allows the width dimension W and therefore the outside dimension of the counterpart substrate 1 to be reduced.

In the present invention, the two pieces may be formed by dividing the flexible substrate in a branching manner by an incision or a slit formed in such a manner as to extend from an intermediate part in the arrangement direction of the circuit patterns to the leading end of the flexible substrate. Thus forming the two branching pieces by an incision or a slit, where the incision or slit requires no space, has the advantage that the two pieces can be formed easily by dividing the flexible substrate with high-density circuit patterns arranged thereon. This advantage becomes pronounced particularly when the two pieces are formed by an incision. The present invention also has the advantage that there is no need to change the connection structure of the flexible substrate to electrical and electronic components to which the flexible substrate is connected at the base end thereof.

The present invention is also directed to a further specified connection structure of a flexible substrate in which solder lands formed in both of the lateral edge portions of the flexible substrate that extends from an optical component in an optical pickup for optically processing a disk and has many parallel circuit patterns arranged thereon are connected by soldering, respectively, to two spaced-apart solder lands formed on a counterpart substrate, wherein the flexible substrate is divided into two branching pieces between adjacent circuit patterns by an incision or a slit formed in such a manner as to extend from an intermediate part in the arrangement direction of the circuit patterns to the leading end of the flexible substrate, and the space between the solder lands on the respective pieces is made equal to the space between the two spaced-apart solder lands on the counterpart substrate by placing the pieces on one another partially so as not to include portions where the solder lands are formed. Then, in addition to the effects provided by the above-described arrangements, the present invention exhibits an effect that the size of the counterpart substrate as a control substrate for the optical pickup can be reduced.

The present invention takes measures so that the space between the solder lands on the flexible substrate is made narrower than in the state where the flexible substrate is kept in a flat shape and is made equal to the space between the two spaced-apart solder lands on the counterpart substrate by placing the two pieces formed by dividing the flexible substrate on one another, which exhibits an effect that the area of a dead space on the counterpart substrate due to being covered with the flexible substrate can be reduced without changing the density of the circuit patterns on the flexible substrate and the outside dimension of the counterpart substrate can be reduced accordingly to facilitate achieving cost reduction. Also, leaving the outside dimension of the counterpart substrate unchanged would exhibit an effect that the reduction in the area of the dead space allows a space for mounting electrical and electronic elements thereon to be ensured easily.

Accordingly, the present invention exhibits an effect that cost reduction can be achieved to optical pickups to be used in DVD drives and the like only by taking measures so that the two pieces are formed by dividing the flexible substrate and the space between the solder lands on the respective pieces is made equal to the space between the two spaced-apart solder lands on the counterpart substrate.

DESCRIPTION OF THE PREFERRED EMBODIMENTS

Figure 1:
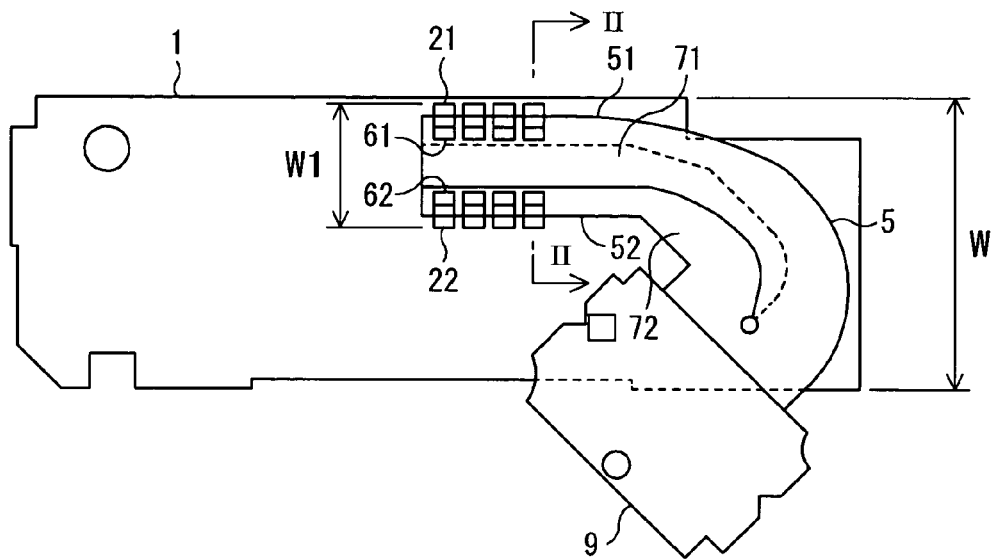
FIG. 1 is a plan view of a connection structure of a flexible substrate according to an embodiment of the present invention.
Figure 2:
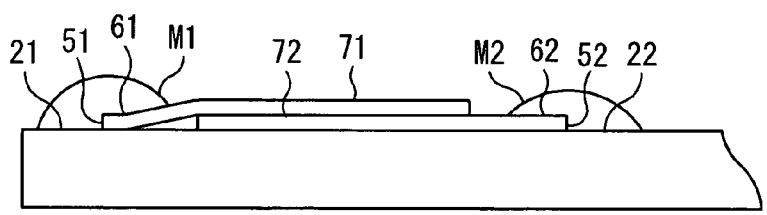
FIG. 2 is an illustrative enlarged cross-sectional view along the arrows II-II in FIG. 1.
Figure 3:
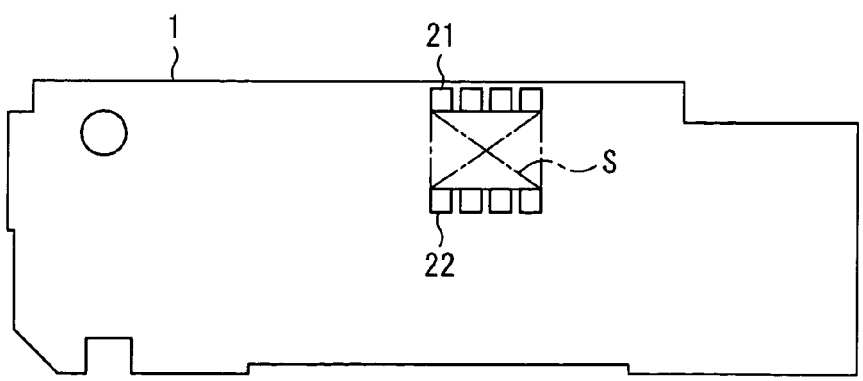
FIG. 3 is a schematic plan view of a counterpart substrate according to the embodiment.

FIG. 1 is a plan view of a connection structure of a flexible substrate according to an embodiment, and FIG. 2 is an illustrative enlarged cross-sectional view along the arrows II-II in FIG. 1. Further, FIG. 3 is a schematic plan view of a counterpart substrate 1 according to the embodiment, and FIG. 4 is a schematic plan view of a flexible substrate 5 according to the embodiment.

In the present embodiment, the counterpart substrate 1 is used as a control substrate for an optical pickup for optically processing a disk as a recording medium to be used in the DVD drive, and the base end portion of the flexible substrate 5 is connected to an optical component 9 such as a photodetector.

As shown in FIG. 1 or 2, the present embodiment has a basic configuration in which solder lands 61 and 62 formed in both of the lateral edge portions 51 and 52 of the flexible substrate 5 that has many parallel circuit patterns arranged thereon are connected by soldering M1 and M2, respectively, to two spaced-apart solder lands 21 and 22 formed on the counterpart substrate 1.

Figure 4:
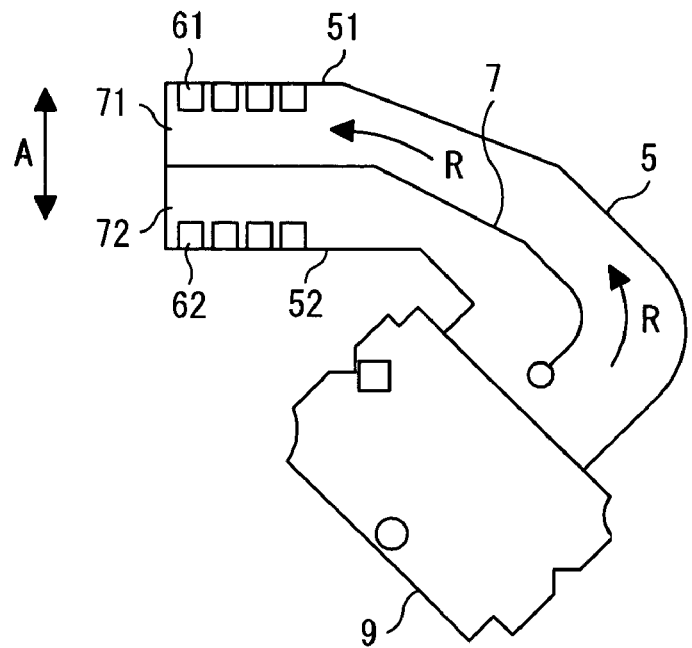
FIG. 4 is a schematic plan view of a flexible substrate according to the embodiment.

As shown in FIG. 4, the flexible substrate 5 according to the present embodiment is formed in a strip shape extending from the optical component 9 to which the base end portion thereof is connected, and is formed in a curved line based on the positional relationship between the counterpart substrate 1 as a control substrate and the optical component 9. Also, many circuit patterns (not shown in the drawing) curved correspondingly to the curved line are formed in parallel on the flexible substrate 5. Therefore, the arrangement direction R of the circuit patterns on the flexible substrate 5 is along the curved direction of the curved flexible substrate 5 as exemplified by the arrow R in FIG. 4, and the width direction A at the leading end portion of the flexible substrate 5, that is, where the solder lands 61 and 62 are formed is approximately orthogonal to the arrangement direction R of the circuit patterns.

As shown in FIG. 4, the approximately entire longitudinal portion of the flexible substrate 5 is divided into two branching pieces 71 and 72 by an incision 7 formed in such a manner as to extend from an intermediate part in the arrangement direction R of the circuit patterns to the leading end of the flexible substrate, excluding the base end portion that is connected to the optical component 9. Therefore, the solder lands 61 and 62 formed in both of the lateral edge portions 51 and 52 of the flexible substrate 5 are provided in lateral edge portions 51 and 52 of the respective pieces 71 and 72. Also, the circuit patterns formed on the flexible substrate 5 remain the same as before the division, though being divided into the two branching pieces 71 and 72. Therefore, forming the two pieces 71 and 72 can cause no change in the density of the circuit patterns on the flexible substrate 5.

On the other hand, the two spaced-apart solder lands 21 and 22 as well as circuit patterns not shown in the drawing are formed, and further necessary elements such as capacitors, ICs, and resistors not shown in the drawing are mounted on the surface of the counterpart substrate 1 shown in FIG. 3. Then, the space between the two spaced-apart solder lands 21 and 22 is made narrower than the space between the solder lands 61 and 62 formed in both of the lateral edge portions 51 and 52 of the flexible substrate 5 shown in FIG. 4 to thereby reduce the area of the space S between the two spaced-apart solder lands 21 and 22.

In the case of connecting the solder lands 61 and 62 formed in both of the lateral edge portions 51 and 52 of the flexible substrate 5 to the two respective spaced-apart solder lands 21 and 22 on the counterpart substrate 1 by soldering M1 and M2 as shown in FIG. 1 or 2, the space between the solder lands 61 and 62 on the respective pieces 71 and 72 is made equal to the space between the two spaced-apart solder lands 21 and 22 on the counterpart substrate 1 by bending one of the two branching pieces 71 and 72 of the flexible substrate 5 to place the pieces on one another partially so as not to include portions where the solder lands are formed.

Employing the arrangement above allows the solder lands 61 and 62 in both of the lateral edge portions 51 and 52 of the flexible substrate 5 to be soldered to the two respective spaced-apart solder lands 21 and 22 on the counterpart substrate 1 without changing the density of the circuit patterns on the flexible substrate 5 even if the space S between the two spaced-apart solder lands 21 and 22 on the counterpart substrate 1 may be narrowed. In addition, the width W1 between the two spaced-apart solder lands 21 and 22 on the counterpart substrate 1 shown in FIG. 1 is reduced to result in a reduction in the area of the dead space, which accordingly allows the width dimension W and therefore the outside dimension of the counterpart substrate 1 to be reduced to achieve cost reduction.

Figure 5:
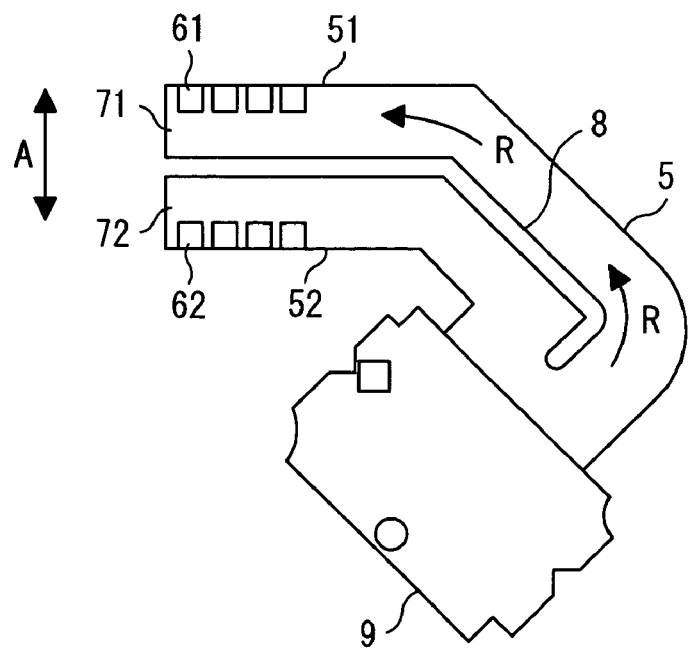
FIG. 5 is a schematic plan view of a flexible substrate including a slit instead of an incision as shown in FIG. 4.
Figure 6:
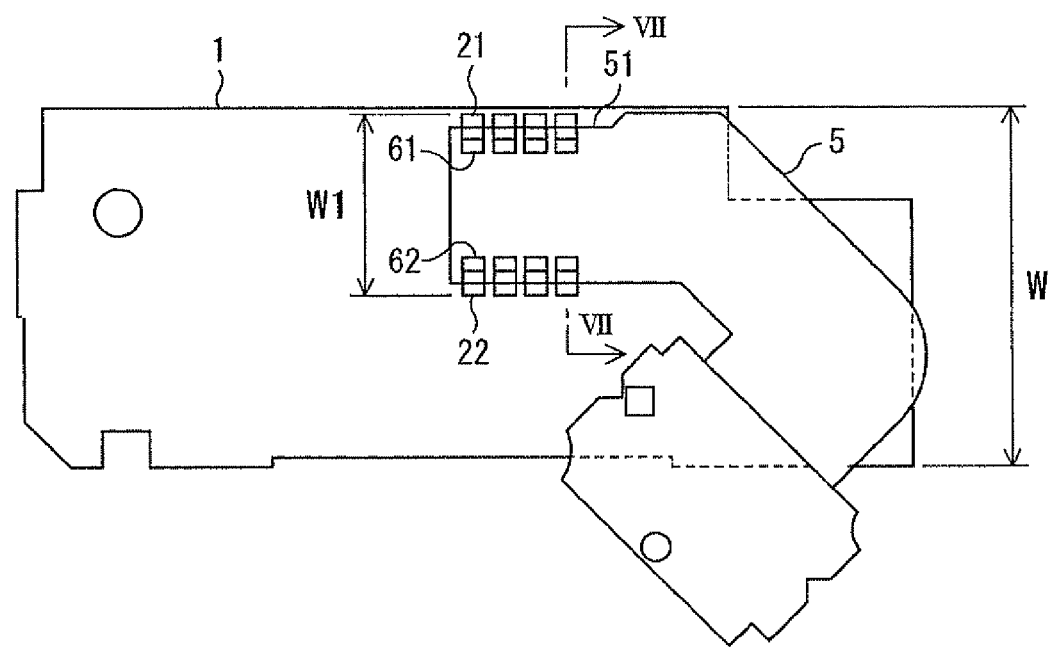
FIG. 6 is a plan view of a connection structure of a flexible substrate according to a conventional example.
Figure 7:
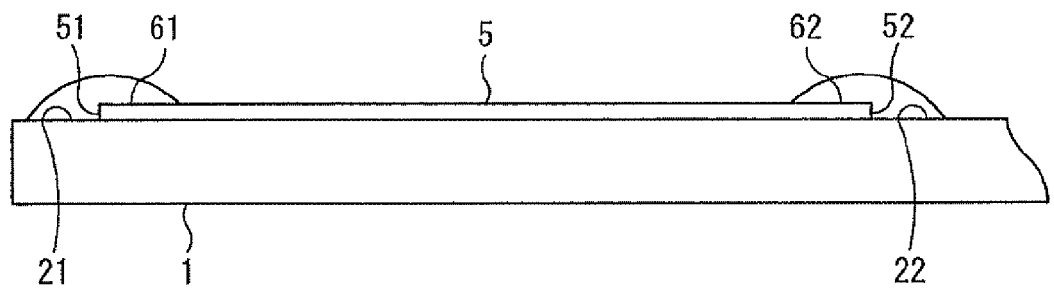
FIG. 7 is an illustrative enlarged cross-sectional view along the arrows VII-VII in FIG. 6.
Figure 8:
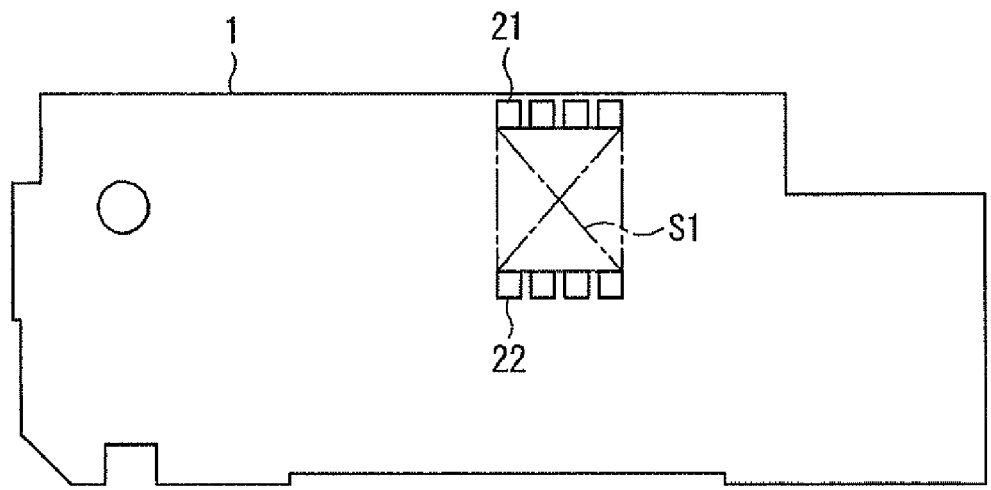
FIG. 8 is a schematic plan view of a counterpart substrate according to the conventional example.
Figure 9:
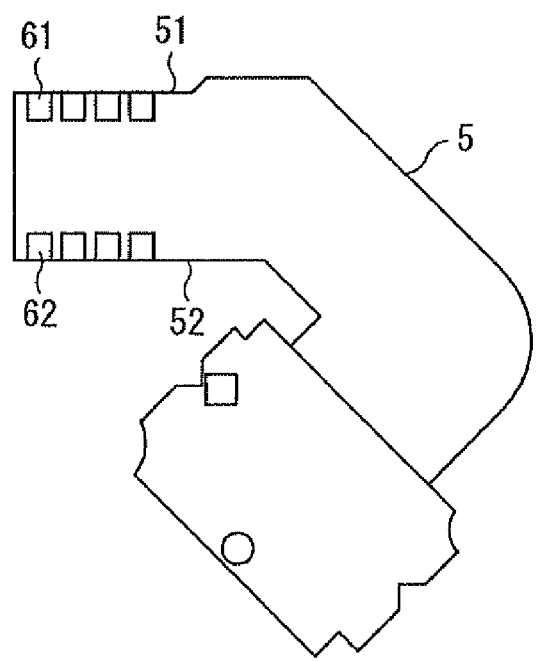
FIG. 9 is a schematic plan view of a flexible substrate according to the conventional example.

In the present embodiment, the two branching pieces 71 and 72 are formed by dividing the flexible substrate 5 by the incision 7 formed therein, but a slit may be used instead of the incision 7, and the case is shown in FIG. 5.

FIG. 5 is a schematic plan view of a flexible substrate 5 including a slit instead of an incision. As shown in FIG. 5, in this case, the approximately entire longitudinal portion of the flexible substrate 5 is divided into two branching pieces 71 and 72 by a slit 8 formed in such a manner as to extend from an intermediate part in the arrangement direction R of the circuit patterns to the leading end of the flexible substrate, excluding the base end portion that is connected to the optical component 9. The other respects are the same as described with reference to FIG. 4. Consequently, the connection structure shown in FIG. 1 can also be achieved by using the flexible substrate 5 according to this case.

Although the flexible substrate 5 has a curved line in the above-described embodiment, the flexible substrate may be formed in a straight strip shape.

It is noted that in FIGS. 1 to 9, identical or corresponding components are designated by the same reference numerals.

What is claimed is:

1. A curved flexible substrate having solder lands on opposing lengthwise edge portions, said flexible substrate extending from a base end connected to an optical component in an optical pickup for optically processing a disk and having a plurality of parallel circuit patterns arranged thereon;

wherein the solder lands on the opposing lengthwise edge portions of the flexible substrate are connected by soldering, respectively, to two spaced-apart solder lands on a counterpart substrate;

wherein said flexible substrate is divided into two branching pieces by an incision or a slit formed between adjacent circuit patterns and extending in parallel with said circuit patterns, from an intermediate position spaced from said base end to a leading end of said flexible substrate;

wherein, with respect to the curve of said flexible substrate, said two branching pieces are a radially outer longer branching piece and a radially inner shorter branching piece;

wherein an overlapping inner lengthwise edge portion of said longer branching piece overlaps an outer lengthwise edge portion of said shorter branching piece but does cover the solder lands on said shorter branching piece; and wherein the overlap between said two branching pieces provides a spacing between said solder lands on one of said lengthwise edge portions and said solder lands on the other lengthwise edge portion equal to a spacing between said two spaced-apart solder lands on said counterpart substrate.

2. A curved flexible substrate having solder lands on opposing lengthwise edge portions, said flexible substrate having a plurality of parallel circuit patterns arranged thereon;

wherein the solder lands on the opposing lengthwise edge portions of the flexible substrate are connected by soldering, respectively, to two spaced-apart solder lands on a counterpart substrate; and wherein said flexible substrate is divided between adjacent circuit patterns into, with respect to the curve of said flexible substrate, a radially outward longer branching piece and a radially inward shorter branching piece; and a spacing between said solder lands on said respective longer and shorter branching pieces is made equal to a spacing between said two spaced-apart solder lands on said counterpart substrate by overlap of a lengthwise edge portion of said longer branching piece over a lengthwise edge portion of said shorter branching piece without covering solder lands on said shorter branching piece.

3. The curved flexible substrate according to claim 2, wherein said longer and shorter branching pieces are formed by an incision in said flexible substrate, said incision extending from an intermediate position spaced from a base end of said flexible substrate, in parallel with said circuit patterns, to a leading end of said flexible substrate.

4. The curved flexible substrate according to claim 2, wherein said longer and shorter branching pieces are formed by a slit in said flexible substrate, said slit extending from an intermediate position spaced from a base end of said flexible substrate, in parallel with of said circuit patterns, to a leading end of said flexible substrate.

* * * * *